US007751016B2

United States Patent
Abe et al.

(10) Patent No.: US 7,751,016 B2
(45) Date of Patent: Jul. 6, 2010

(54) DISPLAY DEVICE HAVING ALIGNMENT MARKS WITH PARTICULAR SHAPES FOR ATTACHING SUBSTRATE AND FPC

(75) Inventors: Hideaki Abe, Chiba (JP); Shinji Tanabe, Mobara (JP); Kouichi Inoue, Mobara (JP); Yasuaki Kondo, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 203 days.

(21) Appl. No.: 11/833,270

(22) Filed: Aug. 3, 2007

(65) Prior Publication Data

US 2008/0030666 A1 Feb. 7, 2008

(30) Foreign Application Priority Data

Aug. 4, 2006 (JP) ............................. 2006-212739

(51) Int. Cl.
*G02F 1/1345* (2006.01)
*H05K 1/00* (2006.01)
(52) U.S. Cl. ........................ 349/150; 361/749; 349/187
(58) Field of Classification Search .................. 349/150
See application file for complete search history.

(56) References Cited

U.S. PATENT DOCUMENTS 5,668,700 A * 9/1997 Tagusa et al. ............... 361/779
7,236,624 B2 * 6/2007 Ohazama ..................... 382/141
7,304,713 B2 * 12/2007 Yi ............................... 349/158
2002/0012096 A1 * 1/2002 Uchiyama ................... 349/187
2003/0053056 A1 * 3/2003 Ohazama ..................... 356/401
2008/0074604 A1 * 3/2008 Yanagawa et al. ........... 349/153

FOREIGN PATENT DOCUMENTS

JP 2003-131584 5/2003

* cited by examiner

*Primary Examiner*—Andrew Schechter
*Assistant Examiner*—Paul C Lee
(74) *Attorney, Agent, or Firm*—Antonelli, Terry, Stout & Kraus, LLP.

(57) ABSTRACT

The present invention can perform, at the time of mounting flexible printed circuit boards on a display substrate, the accurate alignment without wrong mounting. A first alignment mark and a second alignment mark for performing the alignment of a flexible printed circuit board with a display substrate are attached to left and right sides of a group of lines which are formed on the flexible printed circuit board. Further, when at least one of the first alignment mark and the second alignment mark is equally divided into four areas, a shape of the alignment mark in at least one area is a shape obtained by folding back the shape of the alignment mark in other areas.

20 Claims, 10 Drawing Sheets

DISPLAY DEVICE HAVING ALIGNMENT MARKS WITH PARTICULAR SHAPES FOR ATTACHING SUBSTRATE AND FPC

CROSS-REFERENCE TO RELATED APPLICATIONS

The disclosure of Japanese Patent Application No. 2006-212739 filed on Aug. 4, 2006 including the specification, drawings and abstract is incorporated herein by reference in its entirety.

BACKGROUND

1. Field of the Invention

The present invention relates to a display device, and more particularly to a display device which is configured to connect a group of terminals of lines which are formed on a substrate of the display device to a group of terminals of lines of a plurality of printed circuit boards (for example, flexible printed circuit boards (FPC)).

2. Description of the Related Art

A currently available display device represented by a liquid crystal display device performs a display control by applying a voltage to a plurality of lines arranged on a substrate. For example, in case of the liquid crystal display device, a display region is constituted by forming a plurality of scanning lines and a plurality of signal lines which are arranged to intersect the plurality of scanning lines on a TFT substrate, and terminal portions which are connected to the plurality of respective scanning lines and the plurality of signal lines are formed outside the display region. Further, an FPC is connected to the terminal portions via an anisotropic conductive sheet (ACF) for applying a voltage to the terminal portions.

In connecting the terminal portions of the lines on the TFT substrate and the FPCs, to prevent wrong handling of the FPCs connected to the terminal portions on a scanning line side with the FPCs connected to the terminal portions on a signal line side, Japanese Patent Laid-open 2003-131584 (patent document 1) discloses a technique which mounts an identification mark which differs from the mark on the signal line side is mounted on the scanning line side on a substrate in addition to an alignment mark.

SUMMARY

Currently, the small-lot-in-large-kind production has been in progress on a manufacturing site, and a demand for such production is satisfied by mounting plural kinds of FPCs which differ in profile from each other on a TFT substrate. However, in mounting the FPCs which differ in profile on the TFT substrate, when the alignment marks of the FPCs are equal, there arises a drawback that the FPCs are wrongly mounted. The above-mentioned patent document 1 discloses the technique which forms the identification mark different from the alignment mark on the substrate thus preventing the wrong arrangement of the FPC on the scanning line side and the FPC on the signal line side. Such a technique, however, requires the formation of the identification mark in addition to the alignment mark of the FPC.

Accordingly, inventors of the present invention have made extensive studies to overcome this drawback by reviewing a shape of the alignment mark on the FPC side.

In performing the alignment between the TFT substrate and the FPC, there has been known two methods, that is, a method which uses a manual device and a method which uses an automatic device.

In the method which uses the manual device, the alignment mark on the TFT substrate and the alignment mark on the FPC are photographed from below the TFT substrate using two fixed camera units, and an operator performs the alignment of two alignment marks which are displayed on a monitor.

In the method which uses the automatic device, the alignment mark of the TFT substrate and the alignment mark of the FPC are photographed from below the TFT substrate using one movable camera unit, and the alignment is performed based on the position information on two alignment marks.

Currently, as the alignment marks on the FPC side and the TFT substrate side, a mark having a quadrangular shape, a circular shape, a cruciform shape and the like are used.

Accordingly, it is an object of the present invention to provide a display device manufactured at a low cost which can prevent erroneous mounting of FPCs by properly designing a shape of an alignment mark on an FPC side.

According to the present invention, the alignment mark on the FPC is configured such that a ¼ area portion of a current frame shape is changed and other remaining ¾ area portion of the frame shape is not changed.

As an area change specification of this ¼ area portion, the shape of the ¼ area portion may be a shape obtained by folding back the shape of the ¾ area portion (a crank shape) or an obliquely cut shape as shown in FIG. 16.

When such a change of the ¼ area portion is applied to two alignment marks formed on both sides of lines of the FPC in a state that two alignment marks have the same shape and are arranged at the same position, the number of shape change portions becomes five including the current product and hence, the alignment marks can cope with five kinds of FPCs.

Further, when such a change of the ¼ area portion is applied to two alignment marks formed on both sides of lines of the FPC in a state that two alignment marks differ from each other in shape, the alignment marks can cope with twenty-five kinds of FPCs.

According to a first aspect of the present invention, in a display device which mounts a flexible printed circuit board (FPC) on a display substrate, the display device is configured such that a first alignment mark for performing the alignment with the display substrate is attached to the flexible printed circuit board on a left side of a group of lines formed on the flexible printed circuit board, and a second alignment mark for performing the alignment with the display substrate is attached to the flexible printed circuit board on a right side of the group of lines formed on the flexible printed circuit board, and at least one alignment mark of the first alignment mark and the second alignment mark is configured such that, when the alignment mark is equally divided into four areas, a shape of the alignment mark in at least one area is formed in a shape obtained by folding back the shape of the alignment mark in other areas. Here, an original shape of the alignment mark used here is a shape symmetrical in the vertical direction as well as in the lateral direction.

By attaching such alignment marks, it is possible to accurately perform the alignment and, at the same time, it is possible to mount plural kinds of flexible printed circuit boards on one display substrate without an error.

Here, by configuring both the first alignment mark and the second alignment mark such that a shape of the alignment mark in at least one area is formed in a shape obtained by folding back the shape of the alignment mark in other areas, it is possible to further accurately perform the alignment. The first alignment mark or the second alignment mark may be made of metal such as copper which is popularly used as a wiring material of the flexible printed circuit board.

To be more specific, with respect to the first alignment mark or the second alignment mark, by forming the alignment mark in other areas in a quadrangular frame shape, it is possible to accurately perform the alignment. The quadrangular shape may preferably be a square.

Further, as another specific constitution, with respect to the first alignment mark or the second alignment mark, the alignment mark in other areas may be formed in a cruciform shape.

To demonstrate a specific example, the display substrate may be a TFT substrate on which a plurality of scanning lines and a plurality of signal lines which is arranged while intersecting the plurality of scanning lines are formed, and on which thin film transistors are arranged corresponding to intersecting portions of the plurality of scanning lines and the plurality of signal lines, and the display device may be a liquid crystal display device.

According to another aspect of the present invention, in a display device which mounts a flexible printed circuit board on a display substrate, an alignment mark for performing the alignment with the display substrate is attached to the flexible printed circuit board, and the alignment mark is configured such that, when the alignment mark is equally divided into four areas, the alignment mark in at least one area differs from the alignment mark in other areas in shape.

By also attaching such alignment marks, it is possible to accurately perform the alignment and, at the same time, it is possible to mount plural kinds of flexible printed circuit boards on one display substrate without an error.

According to still another aspect of the present invention, in a display device which mounts a flexible printed circuit board on a display substrate, an alignment mark for performing the alignment with the display substrate is attached to the flexible printed circuit board, and the alignment mark is configured such that, when the alignment mark is equally divided into four areas, the shape of the alignment mark in at least one area is a shape obtained by folding back the shape of the alignment mark in other areas.

By also attaching such alignment marks, it is possible to accurately perform the alignment and, at the same time, it is possible to mount plural kinds of flexible printed circuit boards on one display substrate without an error.

According to the present invention, it is possible to prevent wrong mounting of the FPCs having different specifications and hence, an erroneous inclusion of the inappropriate FPC can be prevented.

DETAILED DESCRIPTION OF THE INVENTION

Figure 1:
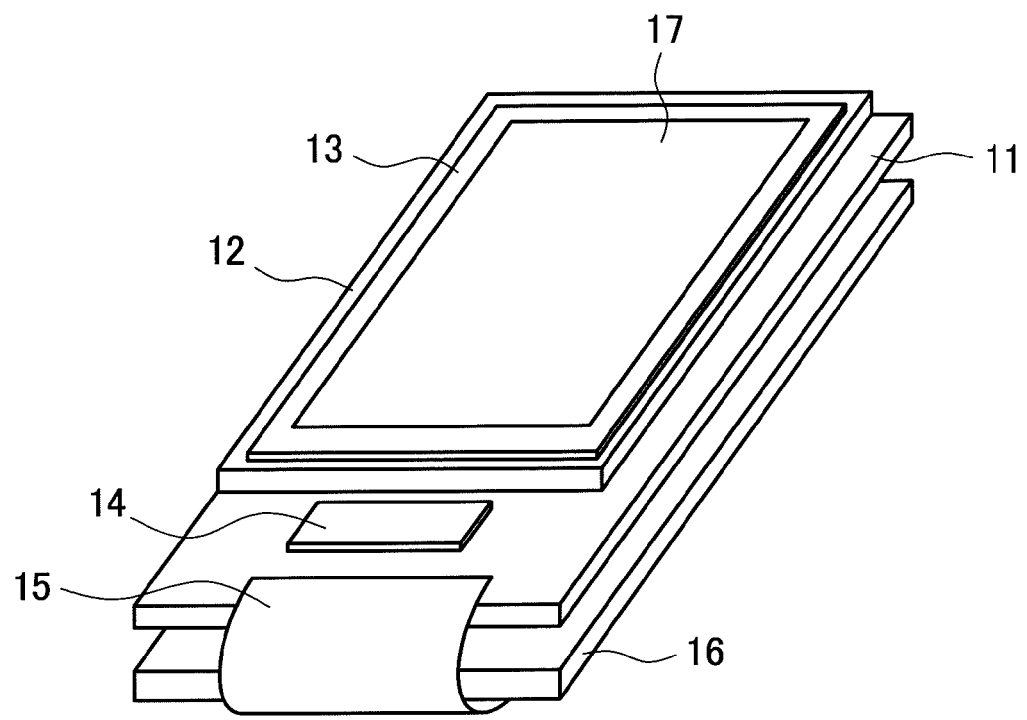
FIG. 1 is an explanatory view of the present invention showing a liquid crystal display module constituted of a liquid crystal display panel and a backlight unit.

FIG. 1 is an explanatory view of the present invention showing a liquid crystal display module constituted of a liquid crystal display panel and a backlight unit.

The liquid crystal display panel is configured by forming a liquid crystal layer between a TFT substrate 11 which is formed of a transparent substrate made of glass or the like and a CF substrate 12 which is formed of a transparent substrate made of glass or the like in the same manner as the TFT substrate 11 and is smaller than the TFT substrate. Then, a polarizer 13 is arranged on the CF substrate 12 thus forming a display region 17. Although not shown in the drawing, the polarizer is also arranged on a TFT substrate side. Further, on the TFT substrate 11, a driver 14 which controls driving of a plurality of scanning lines arranged on the TFT substrate 11 and a plurality of signal lines which are arranged to intersect the plurality of scanning lines is arranged. The driver 14 is connected to a timing controller (TCON) which is arranged on a back side of a backlight unit 16 via a flexible printed circuit board 15.

Figure 2:
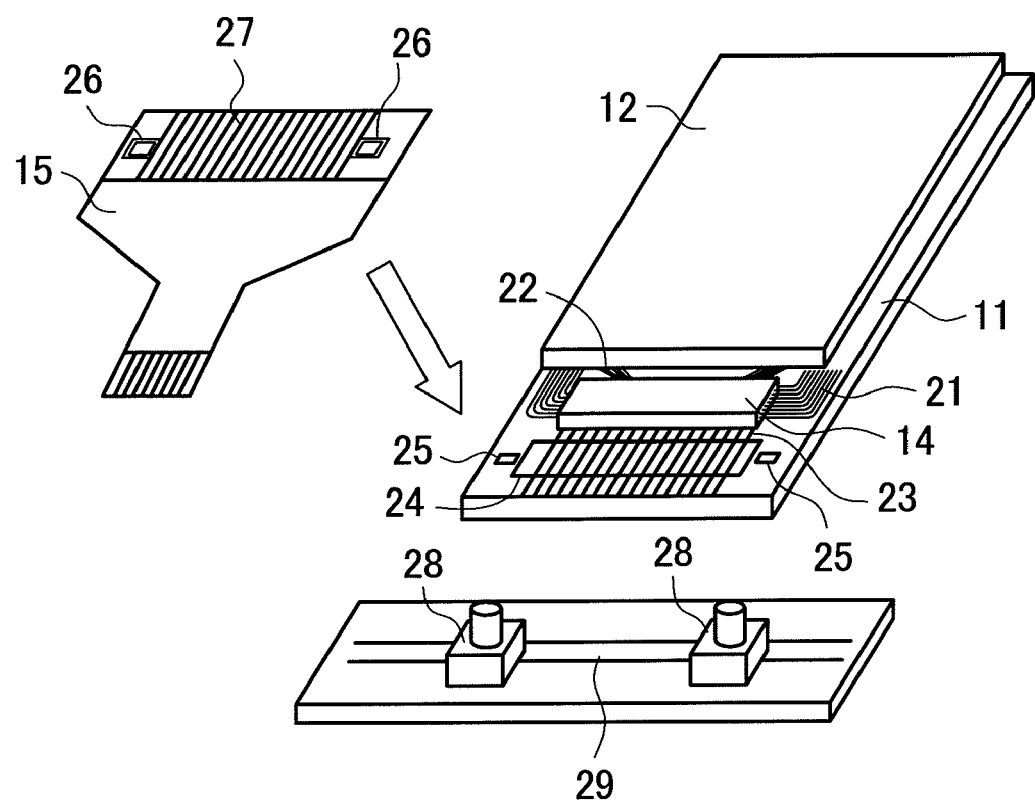
FIG. 2 is a view showing the manner of aligning a TFT substrate and an FPC according to the present invention.

FIG. 2 is a view showing a method according to the present invention for aligning the TFT substrate 11 and the FPC 15 using a manual device.

As shown in FIG. 2, alignment marks 25 on a TFT substrate 11 side are arranged on the TFT substrate 11. The alignment mark 25 on the TFT substrate 11 side is formed into a square shape having one side of 0.2 mm, for example. The alignment marks on the TFT substrate 11 side are formed in the same step for forming lines which are formed on the TFT substrate, and are made of metal such as aluminum, chromium, for example. Further, also on the FPC 15, alignment marks 26 on a FPC 15 side are arranged. The alignment marks 26 on the FPC 15 side are configured in a frame shape such that the alignment marks 26 surround the alignment marks 25 of the TFT substrate 11 when the FPC 15 overlaps the TFT substrate 11. Here, the alignment marks 26 on the FPC 15 side are made of metal such as copper which is also a material of the lines of the FPC, for example. Further, numeral 21 indicates lines which are connected to scanning lines on the display region, numeral 22 indicates lines which are connected to signal lines on the display region. Further, numeral 23 indicates lines which are connected to the driver 14.

In performing the alignment using the manual device, first of all, the FPC 15 is temporarily arranged on the TFT substrate 11, and the respective alignment marks 25, 26 are photographed from below the TFT substrate 11 using two camera units 28 on a movable unit 29. Since the TFT substrate 11 is formed of the transparent substrate made of glass or the like, it is possible to recognize the alignment marks 26 arranged on the FPC 15 from below the TFT substrate 11.

Next, an operator who performs such an alignment performs the fine adjustment of alignment based on an image of the alignment marks displayed on a monitor.

Although lines 27 of the FPC substrate 15 are described in a recognizable manner in FIG. 2 for facilitating the explanation of the present invention, in an actual state, the lines 27 are formed on a back side (a side invisible in FIG. 2).

Figure 3:
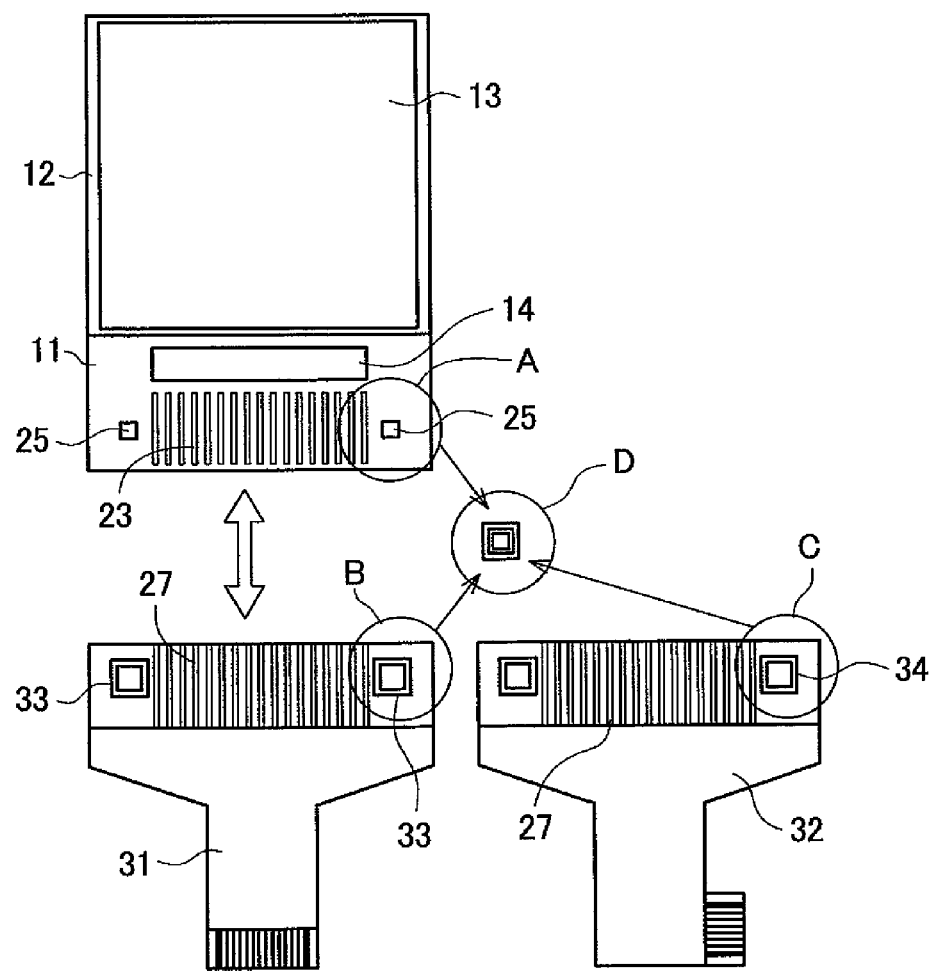
FIG. 3 is a view for explaining a drawback of a related art.

FIG. 3 is a view for explaining a drawback of the related art.

Currently, to achieve a demand for small-lot-in-large-kind production at a low cost, a demand for large kinds is satisfied by allowing two or more kinds of FPCs to be compatible with one kind of TFT substrate, for example.

FIG. 3 shows such an example in which two kinds of FPCs 31, 32 are compatible with one kind of TFT substrate 11. In such a case, the alignment of the TFT substrate 11 and the FPC 31 is performed in accordance with the steps explained in conjunction with FIG. 2. When alignment marks 33 of the FPC 31 and alignment marks 34 of the FPC 32 are equal, it may be possible to perform the alignment of the TFT substrate 11 and the FPC 31 or the FPC 32. However, there exists a possibility that the FPC 31 and the FPC 32 are wrongly mounted. That is, in a product which mounts the FPC 31 on the TFT substrate 11 thereon, a shape of a D portion is confirmed by overlapping an A portion of the TFT substrate 11 and a B portion of the FPC 31. However, such a shape is equal to a shape which is obtained by overlapping the A portion of the TFT substrate 11 and a C portion of the FPC 32 and hence, even when an operator wrongly arranges the FPC, there exists a possibility that such wrong arrangement is overlooked.

To cope with such a drawback, the TFT substrate and the FPC may be designed with the one-to-one correspondence. However, the individual designing of the FPC makes the reduction of cost difficult.

The present invention provides the display device which allows large kinds of FPCs to be compatible with one kind of TFT substrate without wrong mounting.

In view of the above-mentioned circumstance, the inventors of the present invention have made an attempt to design a shape of the alignment marks on the FPC side to satisfy such a demand.

As mentioned previously, the alignment of the TFT substrate and the FPC is performed by overlapping two alignment marks consisting of the alignment mark of the TFT substrate and the alignment mark of the FPC. For example, the alignment mark of the TFT substrate has a square shape, and the alignment mark of the FPC is a frame-shaped alignment mark which is configured to surround the square alignment mark.

Figure 4:
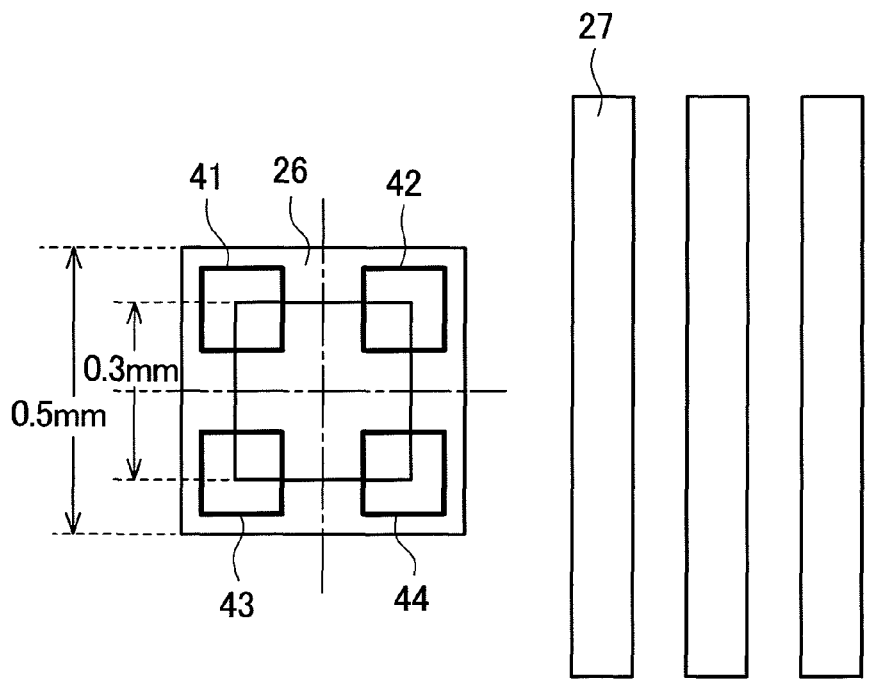
FIG. 4 is a view showing an alignment mark on an FPC side.

FIG. 4 shows the alignment mark 26 on the FPC side. Here, numeral 27 in FIG. 4 indicates lines which are arranged on the FPC.

As shown in FIG. 4, the alignment mark 26 on the FPC side has the frame-shape having a width of 0.1 mm, for example, wherein one side of an outer frame is 0.5 mm and one side of a portion from which the frame is removed is 0.3 mm. The camera units 28 shown in FIG. 2 can recognize four portions 41, 42, 43, 44 at maximum with respect to this alignment mark 26. In case of the alignment mark 26 shown in FIG. 4, area portions 41, 42, 43, 44 each of which is an area portion where both a black pattern (a portion where the alignment mark 26 is formed) and a white pattern (portion where the alignment mark 26 is not formed) exist are set as recognizable portions.

Figure 5:
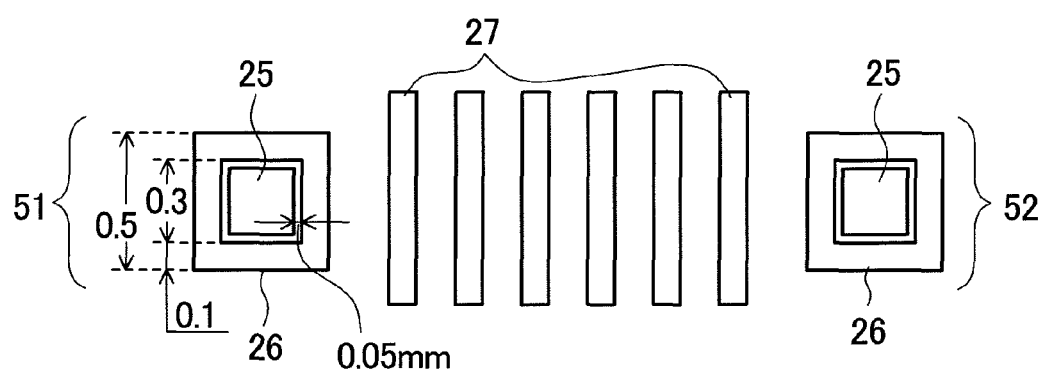
FIG. 5 is a view showing a state in which an FPC and the TFT substrate overlap each other.

FIG. 5 shows a state in which the FPC and the TFT substrate overlap each other. That is, FIG. 5 shows a state in which the alignment marks 25 on the TFT substrate side enter the inside of the alignment marks 26 of the FPC. In performing the alignment using a manual device, an operator performs the fine adjustment of the alignment of the FPC and the TFT substrate while confirming an image displayed on a monitor on which the left and right alignment marks are displayed. The clearance between the alignment mark 25 of the TFT substrate and the alignment mark 26 of the FPC which is formed when the alignment mark 25 of the TFT substrate and the alignment mark 26 of the FPC are normally aligned with each other is 0.05 mm.

Embodiment 1

Figure 6:
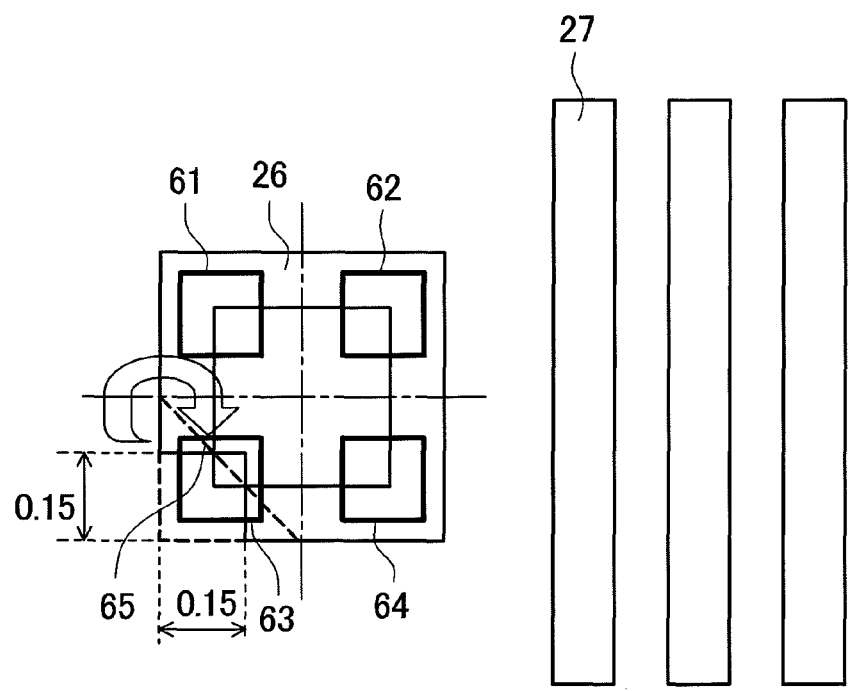
FIG. 6 is a view showing an embodiment 1 of the present invention.

FIG. 6 shows an embodiment 1 of the present invention.

The present invention is characterized in that the alignment mark 26 of the FPC is configured such that, compared to a current frame shape, a ¼ area portion of the frame shape is changed and a remaining ¾ portion of the frame shape is not changed. This constitution is brought about based on an idea that the recognizable portions by the camera unit 28 are four portions at maximum, and only one portion out of four portions of the alignment mark is changed to allow an operator to perform the alignment without feeling any discomfort.

In the ¼ area portion at a left lower portion of the alignment mark 26 shown in FIG. 6, the frame-shaped alignment mark is configured to be folded back along a folding line 65.

Figure 7:
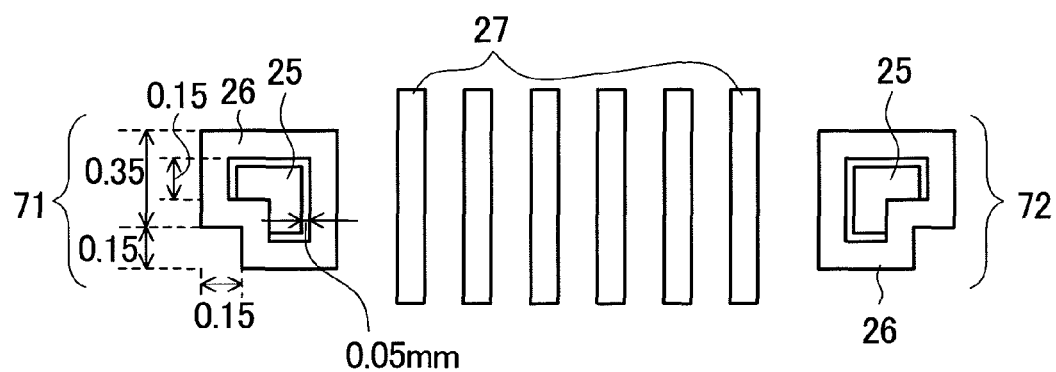
FIG. 7 is a view showing a state in which an alignment mark of the FPC shown in FIG. 6 overlaps the alignment mark of the TFT substrate.
Figure 8:
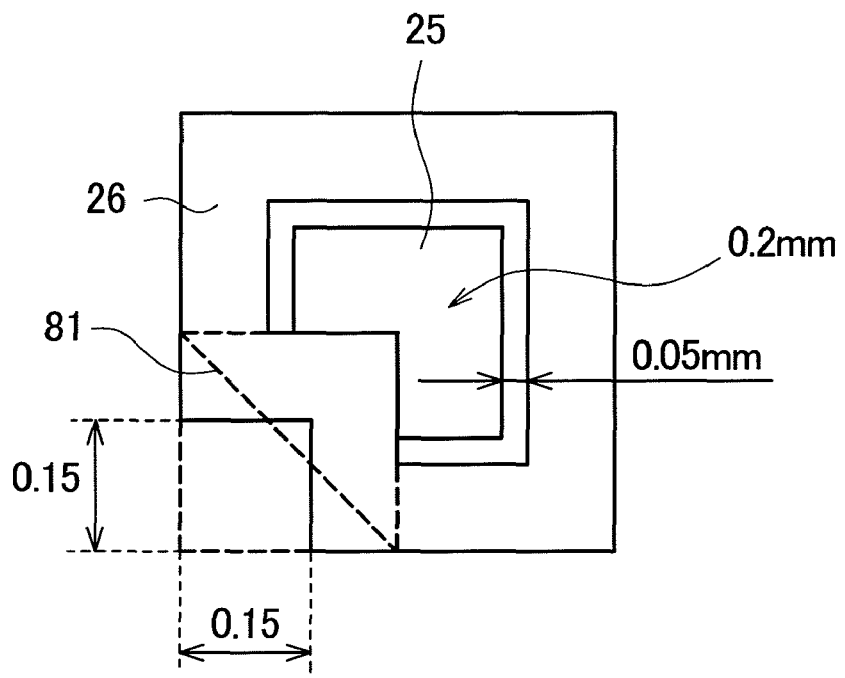
FIG. 8 is a view showing the alignment mark in FIG. 7 in a further enlarged manner.

FIG. 7 is a view showing a state in which the alignment mark 26 of the FPC shown in FIG. 6 and the alignment mark 25 of the TFT substrate overlap to each other. In performing the position recognition using the manual device, an operator, first of all, performs the fine adjustment of the alignment by confirming the left and right alignment marks 71, 72 using a monitor screen. In the present invention, the ¼ area portion of the alignment mark 26 on the FPC side of the left-side alignment mark 71 (the combined mark of the alignment mark 25 and the alignment mark 26), and the ¼ area portion of the alignment mark 26 on the FPC side of the right-side alignment mark 72 (the combined mark of the alignment mark 25 and the alignment mark 26) are configured to be folded back. However, due to the shape of the remaining ¾ area portion, the operator can perform the alignment operation without feeling any discomfort. Further, the ¼ area portion of the alignment mark 26 of the FPC exhibits the fold-back shape compared to the shape of other ¾ area portion and hence, it is possible to impart different alignment marks for respective kinds of the FPCs thus preventing the wrong mounting of the FPC. Here, FIG. 8 is a view showing the alignment mark 71 in FIG. 7 in a further enlarged manner.

Figure 15:
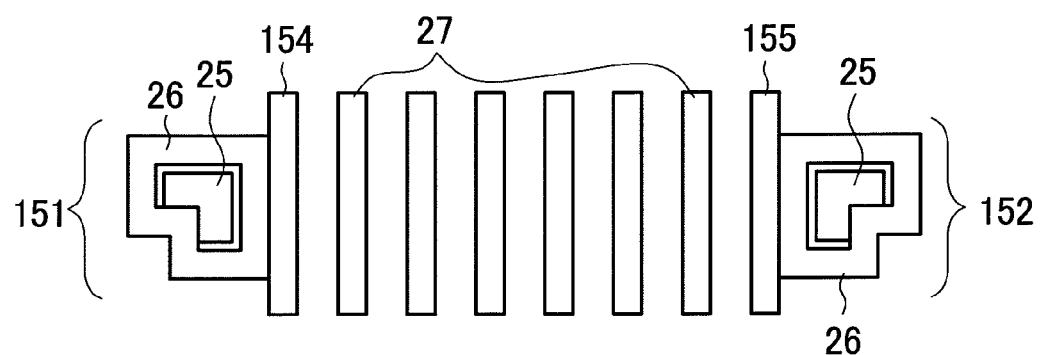
FIG. 15 is a view showing another constitution of the embodiment 1 of the present invention.
Figure 16:
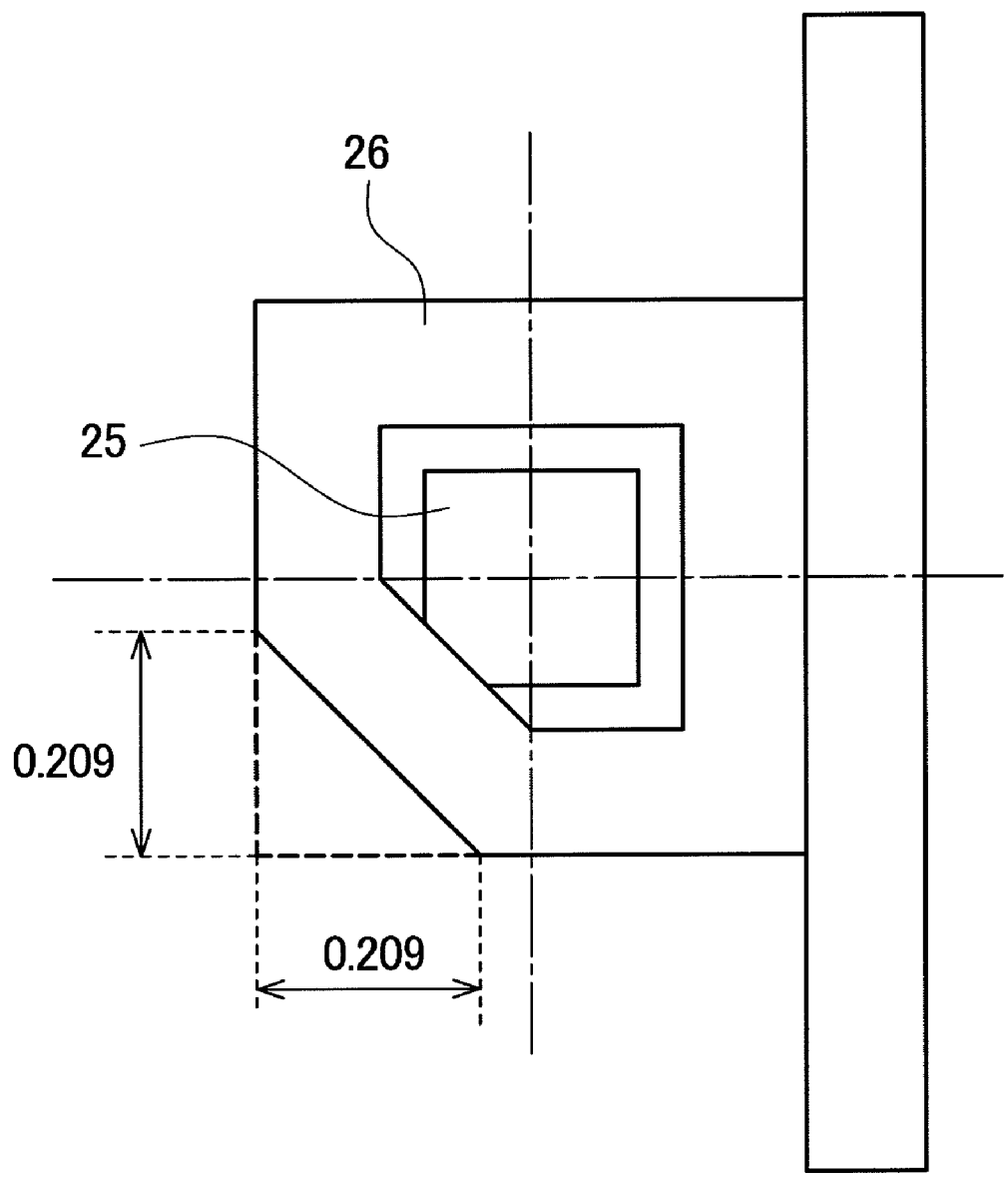
FIG. 16 is a view showing another embodiment of the present invention.

FIG. 15 shows the constitution in which the alignment marks 26 of the FPC and the lines 27 arranged on the FPC are arranged close to each other. The alignment mark 26 is made of copperas mentioned previously, and plating is usually applied to copper. As a method for applying plating, electrolytic plating and electroless plating are considered. In applying the electrolytic plating, to allow the plating to extend over the alignment mark, the alignment mark is connected to the neighboring metal line. It is needless to say that the present invention is characterized by the shape of the alignment mark and hence, whether the alignment mark is connected to the line or not is not important.

Embodiment 2

Figure 9:
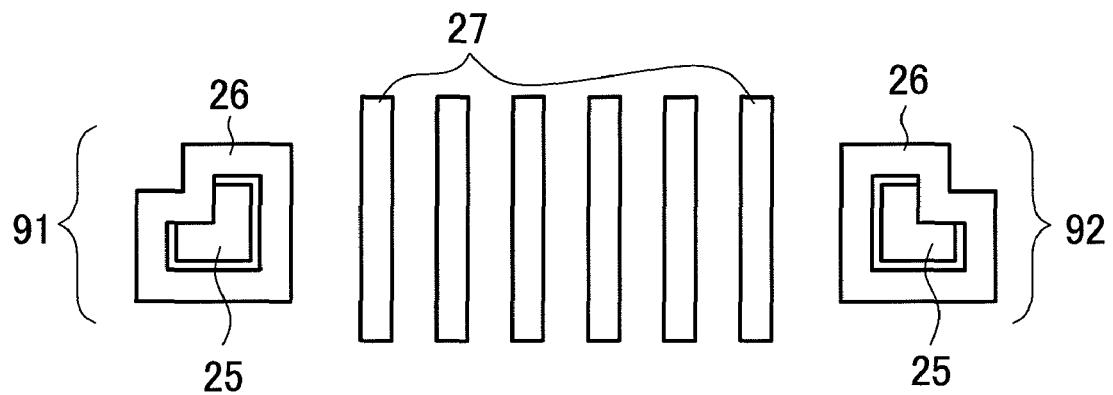
FIG. 9 is a view showing an embodiment 2 of the present invention.

FIG. 9 is a view showing an embodiment 2 of the present invention.

Figure 10:
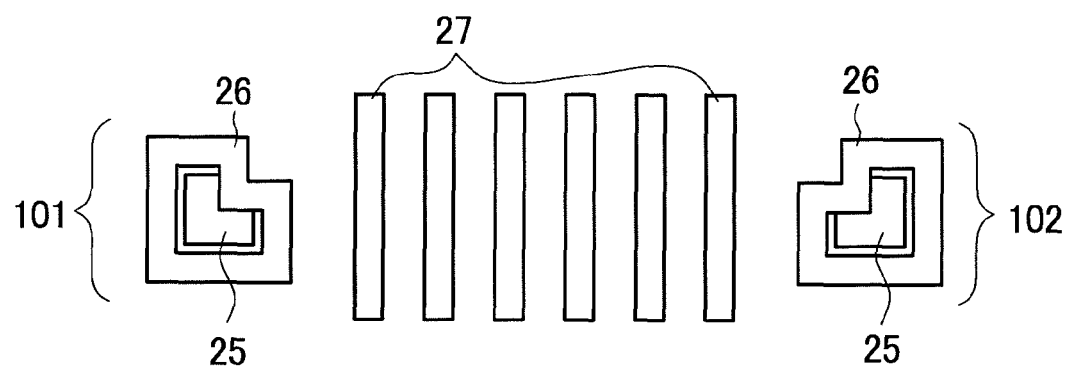
FIG. 10 is a view showing a modification of the embodiment 2 of the present invention.
Figure 11:
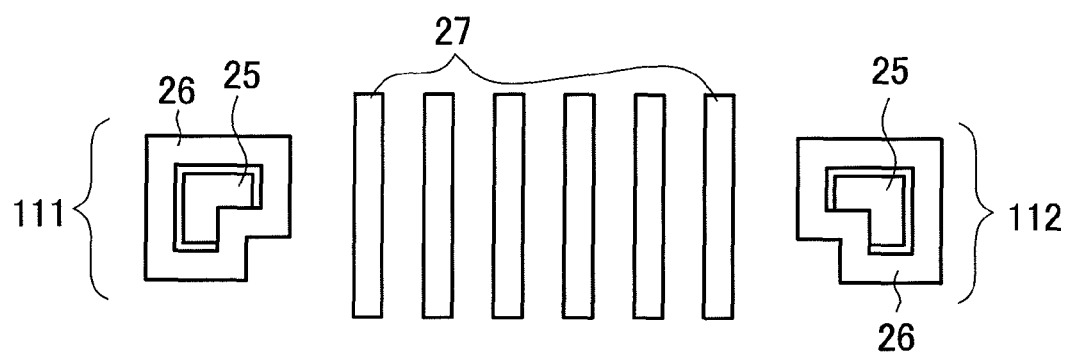
FIG. 11 is a view showing another modification of the embodiment 2 of the present invention.

This embodiment 2 differs from the embodiment 1 with respect to a point that the embodiment 1 forms the ¼ area portion to be changed in the left lower area portion of the alignment mark 26 of the FPC, while the embodiment 2 forms such a ¼ area portion to be changed at a left upper area portion of the alignment mark 26 of the FPC. To enable the mounting of plural kinds of FPCs on one TFT substrate, by setting the FPC to which the alignment mark 26 of the embodiment 1 is attached as one kind and the FPC to which the alignment mark 26 shown in FIG. 9 is attached as another kind, it is possible to provide the display device which can prevent the wrong mounting. As shown in FIG. 10, it is needless to say that the ¼ area portion to be changed of the alignment mark 26 on the FPC can be formed in a right upper area portion of the alignment mark 26. Still further, as shown in FIG. 11, it is needless to say that the ¼ area portion to be changed of the alignment mark 26 of the FPC can be formed in a right lower area portion of the alignment mark 26.

Embodiment 3

Figure 12:
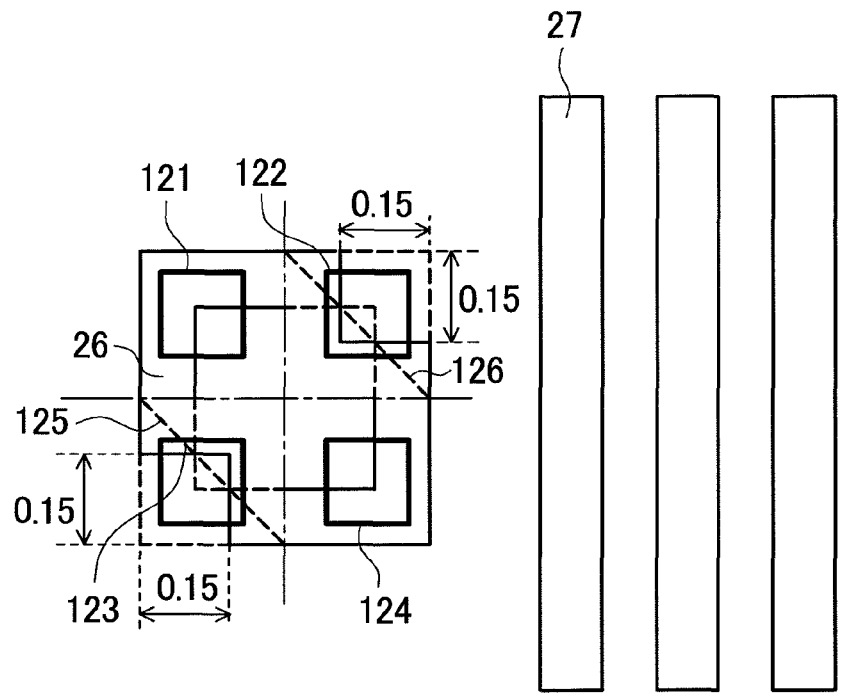
FIG. 12 is a view showing an embodiment 3 of the present invention.

FIG. 12 is a view showing an embodiment 3 of the present invention.

While the embodiments 1 and 2 change the ¼ area portion of the alignment mark 26 of the FPC, the embodiment 3 changes a ¾ area portion. Although four area portions consisting of area portions 121, 122, 123, 124 can be recognized by the camera units 28, two area portions out of these four area portions are folded back. In this manner, the alignment mark 26 can be configured to fold back the ¾ area portion in place of folding back the ¼ area portion thereof.

Embodiment 4

Figure 13:
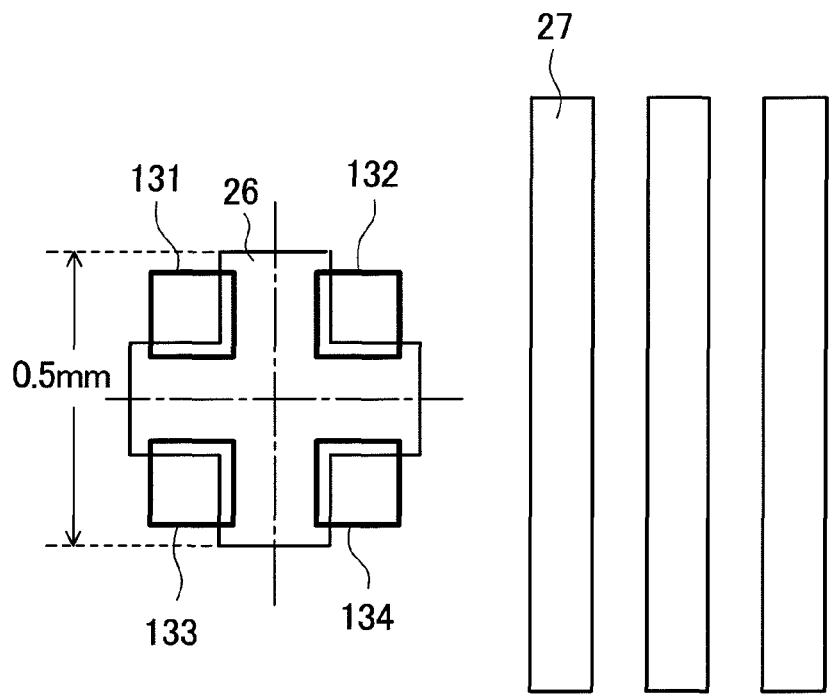
FIG. 13 is a view for explaining an embodiment 4 of the present invention.

While the alignment mark 26 of the FPC in the embodiments 1 to 3 has a quadrangular frame shape as a base shape, the embodiment 4 adopts a cruciform alignment mark 26 shown in FIG. 13 as a base shape, for example.

Even when the cruciform alignment mark 26 shown in FIG. 13 is adopted, four area portions consisting of area portions 131, 132, 133, 134 become area portions to be recognized by the camera units 28.

Figure 14:
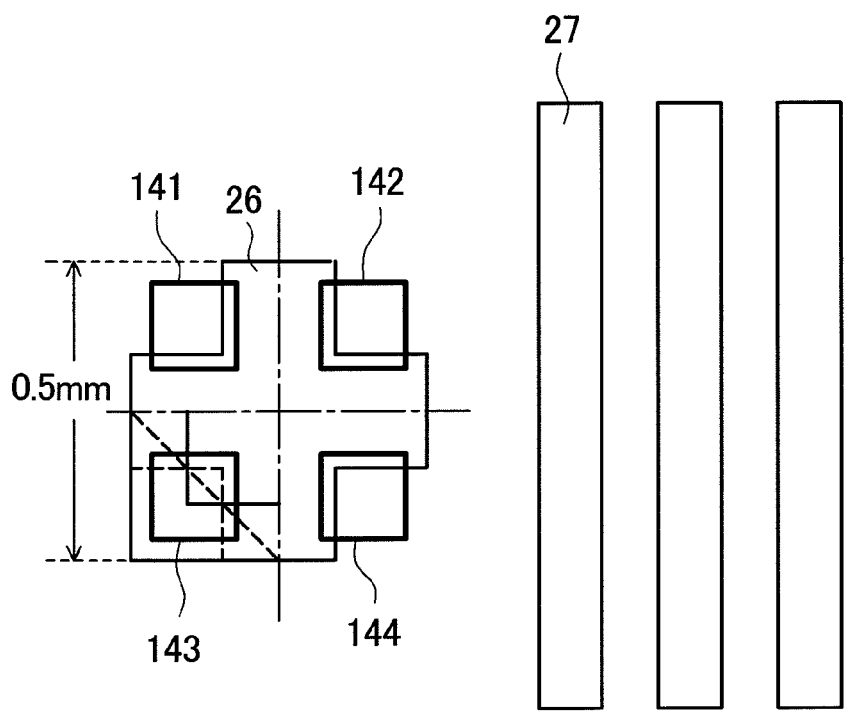
FIG. 14 is a view showing the embodiment 4 of the present invention.

FIG. 14 shows the specific constitution which changes the ¼ area portion of the cruciform alignment mark 26. In FIG. 14, the cruciform alignment mark 26 is configured such that a left lower portion of the alignment mark 26 is folded back along a folding line 145.

What is claimed is:

1. A display device which mounts a flexible printed circuit board on a display substrate, the display device being configured such that:
    a first alignment mark for performing the alignment with the display substrate is attached to the flexible printed circuit board on a left side of a group of lines formed on the flexible printed circuit board, and a second alignment mark for performing the alignment with the display substrate is attached to the flexible printed circuit board on a right side of the group of lines formed on the flexible printed circuit board, and
    at least one alignment mark of the first alignment mark and the second alignment mark is configured such that, when the alignment mark is equally divided into four areas, a shape of the alignment mark in only one area of the four areas is formed in a shape corresponding to a shape obtained by folding back the shape of the alignment mark in other areas of the four areas.

2. A display device according to claim 1, wherein the first alignment mark and the second alignment mark are configured such that the shape of the alignment mark in the only one area is formed in the shape corresponding to the shape obtained by folding back the shape of the alignment mark in the other areas.

3. A display device according to claim 1, wherein the first alignment mark or the second alignment mark is made of metal.

4. A display device according to claim 1, wherein with respect to the first alignment mark or the second alignment mark, the alignment mark in the other areas is formed in a quadrangular frame shape.

5. A display device according to claim 4, wherein the quadrangular shape is a square shape.

6. A display device according to claim 1, wherein with respect to the first alignment mark or the second alignment mark, the alignment mark in the other areas is formed in a cruciform shape.

7. A display device according to claim 1, wherein the display substrate is a TFT substrate on which a plurality of scanning lines and a plurality of signal lines which is arranged while intersecting the plurality of scanning lines are formed, and on which thin film transistors are arranged corresponding to intersecting portions of the plurality of scanning lines and the plurality of signal lines, and the display device is a liquid crystal display device.

8. A display device according to claim 1, wherein the first alignment mark or the second alignment mark is formed so that the other areas have a symmetrical shape in the vertical direction as well as in the lateral direction.

9. A display device which mounts a flexible printed circuit board on a display substrate, the display device being configured such that
    an alignment mark for performing alignment with the display substrate is attached to the flexible printed circuit board,
    the alignment mark is configured such that, when the alignment mark is equally divided into four areas, the alignment mark in only one area of the four areas differs from the alignment mark in other areas of the four areas in shape.

10. A display device according to claim 9, wherein both the first alignment mark and the second alignment mark are configured such that the shape of the alignment mark in the only one area is formed in a shape corresponding to a shape obtained by folding back the shape of the alignment mark in the other areas.

11. A display device according to claim 9, wherein the first alignment mark or the second alignment mark is made of metal.

12. A display device according to claim 9, wherein the display substrate is a TFT substrate on which a plurality of scanning lines and a plurality of signal lines which is arranged while intersecting the plurality of scanning lines are formed, and on which thin film transistors are arranged corresponding to intersecting portions of the plurality of scanning lines and the plurality of signal lines, and the display device is a liquid crystal display device.

13. A display device according to claim 9, wherein the alignment mark in the only one area has a different shape from the alignment mark in the other areas which have a symmetrical shape in the vertical direction as well as in the lateral direction.

14. A display device which mounts a flexible printed circuit board on a display substrate, the display device being configured such that
    an alignment mark for performing alignment with the display substrate is attached to the flexible printed circuit board, the alignment mark is configured such that, when the alignment mark is equally divided into four areas, the shape of the alignment mark in only one area of the four areas is formed in a shape corresponding to a shape obtained by folding back the shape of the alignment mark in other areas of the four areas.

15. A display device according to claim 14, wherein both the first alignment mark and the second alignment mark are configured such that the shape of the alignment mark in the one area is formed in the shape corresponding to a shape obtained by folding back the shape of the alignment mark in the other areas.

16. A display device according to claim 14, wherein the first alignment mark or the second alignment mark is made of metal.

17. A display device according to claim 14, wherein with respect to the first alignment mark or the second alignment mark, the alignment mark in the other areas is formed in a quadrangular frame shape.

18. A display device according to claim 17, wherein the quadrangular shape is a square shape.

19. A display device according to claim 14, wherein with respect to the first alignment mark or the second alignment mark, the alignment mark in the other areas is formed in a cruciform shape.

20. A display device according to claim 14, wherein the alignment mark has, in the other areas, a symmetrical shape in the vertical direction as well as in the lateral direction.

* * * * *